(12) United States Patent
Li et al.

(10) Patent No.: US 10,796,777 B1
(45) Date of Patent: *Oct. 6, 2020

(54) METHOD FOR PROGRAMMING IN NON-VOLATILE MEMORY DEVICE BY APPLYING MULTIPLE BITLINE BIAS VOLTAGES

(71) Applicant: Yangtze Memory Technologies Co., Ltd., Wuhan, Hubei Province (CN)

(72) Inventors: Haibo Li, Wuhan (CN); Chao Zhang, Wuhan (CN); Yanxia Lin, Wuhan (CN)

(73) Assignee: Yangtze Memory Technologies Co., Ltd., Wuhan, Hubei Province (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/404,744

(22) Filed: May 7, 2019

Related U.S. Application Data (63) Continuation of application No. PCT/CN2019/079667, filed on Mar. 26, 2019.

(51) Int. Cl.
*G11C 16/34* (2006.01)
*G11C 16/24* (2006.01)
*G11C 16/10* (2006.01)
G11C 16/04 (2006.01)

(52) U.S. Cl.
CPC .......... *G11C 16/3459* (2013.01); *G11C 16/10* (2013.01); *G11C 16/24* (2013.01); *G11C 16/0483* (2013.01)

(58) Field of Classification Search
CPC ..... G11C 16/3459; G11C 16/10; G11C 16/24; G11C 16/0483; G11C 16/048
See application file for complete search history.

(56) References Cited

U.S. PATENT DOCUMENTS

| 7,995,395 | B2 | 8/2011 | Moschiano |
| 8,081,514 | B2 | 12/2011 | Mui |
| 8,953,386 | B2 | 2/2015 | Dutta |
| 2006/0227618 | A1 | 10/2006 | Lee |
| 2011/0007571 | A1* | 1/2011 | Park ................... G11C 11/5628 365/185.22 |

(Continued)

FOREIGN PATENT DOCUMENTS

| CN | 101960533 A | 1/2011 |
| CN | 102576566 A | 7/2012 |

(Continued)

*Primary Examiner* — Jay W. Radke
(74) *Attorney, Agent, or Firm* — Winston Hsu (57) ABSTRACT

Programming in a non-volatile memory device includes applying at least one programming pulse to a non-volatile memory cell during a first programming loop; applying at least one programming pulse to the non-volatile memory cell during a second programming loop succeeding the first programming loop; and providing a bitline bias voltage of the non-volatile memory cell according to a result of comparing a threshold voltage of the non-volatile memory cell in the first programming loop with a low verify level and/or a high verify level of a target data state of the non-volatile memory cell and a result of comparing a threshold voltage of the non-volatile memory cell in the second programming loop with the low verify level and/or the high verify level of the target data state of the non-volatile memory cell.

12 Claims, 5 Drawing Sheets

(56) References Cited

U.S. PATENT DOCUMENTS

| | | |
|---|---|---|
| 2012/0140566 A1 | 6/2012 | Aritome |
| 2013/0077408 A1 | 3/2013 | Ueno |
| 2014/0063974 A1 | 3/2014 | Yang |
| 2016/0314843 A1 | 10/2016 | Tseng |
| 2017/0186497 A1 | 6/2017 | Rajwade |
| 2018/0277231 A1* | 9/2018 | Kondo ................... G11C 16/10 |

FOREIGN PATENT DOCUMENTS

| | | |
|---|---|---|
| CN | 105051824 A | 11/2015 |
| KR | 10-20080061522 A | 7/2008 |
| TW | 201440071 A | 10/2014 |
| TW | 201611032 A | 3/2016 |
| WO | 20141066263 A1 | 5/2014 |

\* cited by examiner

METHOD FOR PROGRAMMING IN NON-VOLATILE MEMORY DEVICE BY APPLYING MULTIPLE BITLINE BIAS VOLTAGES

CROSS REFERENCE TO RELATED APPLICATIONS

This application is a continuation of International Application No. PCT/CN2019/079667, filed on Mar. 26, 2019, which is incorporated by reference herein in its entirety.

BACKGROUND OF THE INVENTION

1. Field of the Invention

The present invention is related to a method for programming in non-volatile memory devices, and more particularly to a method for programming in non-volatile memory devices by applying multiple bitline bias voltages to reduce the influence of instant threshold voltage shift, and the distribution lower tail being below a target verify level because of read noise or random telegraph noise (RTN).

2. Description of the Prior Art

Non-volatile memory devices, such as flash memory, have become the storage of choice in a variety of mobile devices. Unlike random access memory, flash memory is non-volatile and retains its stored data even after power is turned off.

Incremental step pulse programming (ISPP) is a key enabler for achieving tight threshold voltage distribution for multi-level cell flash memory. The method is characterized by gradually increasing the program voltage by a step size to enable fast programming of both easy and hard cells. However, the reliability of this programming method may be compromised by instant threshold voltage shift. It is a phenomenon which the programmed threshold voltage shifts down within milliseconds after programming. The current programming method is not able to handle this issue, and it can leave a large number of cells below the target verify level. Read noise or random telegraph noise (RTN) is another source of cells with Vt below the target verify level in that their Vt could be read higher than the target verify level because of the noise. A method of multiple verify operations after a program pulse was proposed to reduce this noise-related issue, but the program speed would be compromised because of the added verify steps.

SUMMARY OF THE INVENTION

An embodiment provides a method for programming in a non-volatile memory device. The method includes applying at least one programming pulse to a non-volatile memory cell during a first programming loop; applying at least one programming pulse to the non-volatile memory cell during a second programming loop succeeding the first programming loop; and providing a bitline bias voltage of the non-volatile memory cell according to a result of comparing a threshold voltage of the non-volatile memory cell in the first programming loop with a low verify level and/or a high verify level of a target data state of the non-volatile memory cell and a result of comparing a threshold voltage of the non-volatile memory cell in the second programming loop with the low verify level and/or the high verify level of the target data state of the non-volatile memory cell.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
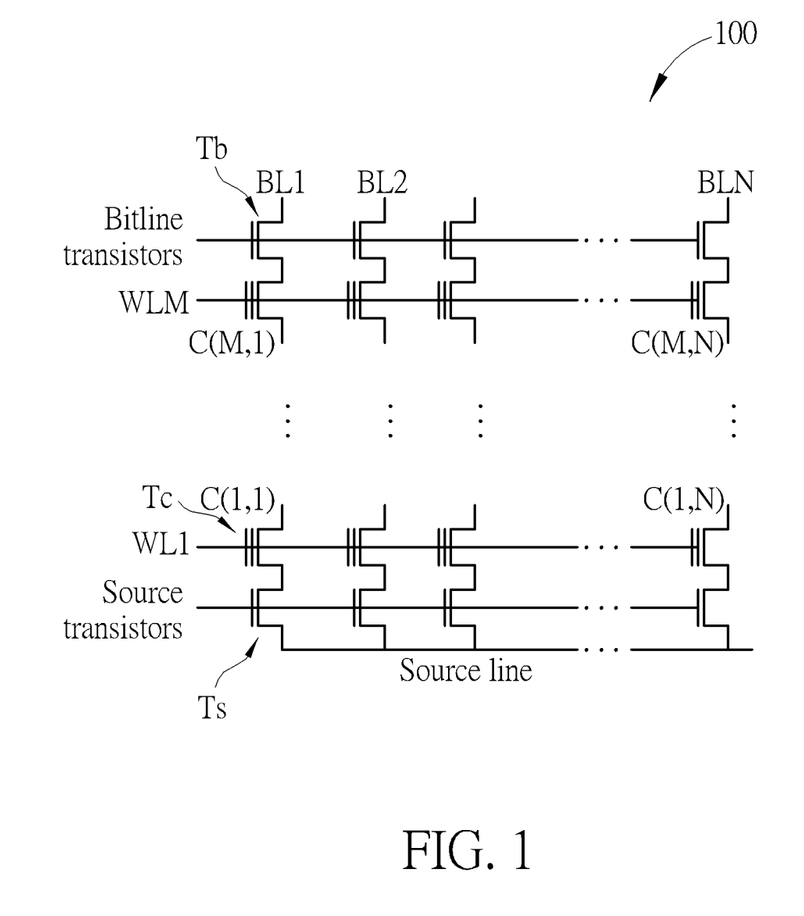
FIG. 1 shows a non-volatile memory device 100 according to an embodiment.

FIG. 1 shows a non-volatile memory device 100 of an embodiment of the present invention. The non-volatile memory device 100 includes a plurality of memory cells C(1,1) to C(M,N), where M and N are positive integers. In some embodiments of the present invention, the non-volatile memory device 100 can be a NAND type flash memory. N memory cells can be coupled to the same corresponding wordline and M memory cells can be coupled to the same corresponding bitline. For example, memory cells C(1,1) to C(1,N) can be coupled to a wordline WL1, and memory cells C(M,1) to C(M,N) can be coupled to a wordline WLM. Memory cells C(1,1) to C(M,1) can be coupled to a bitline BL1, and memory cells C(M,1) to C(M,N) can be coupled to a bitline BLN. One terminal of a memory column is coupled to a bitline via a bitline transistor Tb and the other terminal is coupled to a source line via a source transistor Ts.

Each of the memory cells C(1,1) to C(M,N) can comprise a transistor Tc. The transistor Tc can be, for example, a floating gate transistor or a charge trapping transistor. During a programming loop of a program operation for the memory cells C(1,1) to C(M,N), the gate terminals of the transistors Tc of the memory cells C(1,1) to C(M,N) can receive a programming pulse from the wordlines WL1 to WLM, and bitline terminals of the transistors Tc can receive bitline bias voltages from the bitlines BL1 to BLN. The voltage of the programming pulse can increase by a step size during the next programming loop. This method is commonly known as incremental step pulse programming (ISPP).

ISPP allows electrons to be injected to the gate structures of the transistors Tc, thus increasing the threshold voltages of the transistors Tc by step size voltages. The threshold voltage would increase to pass a verify level of a target data state. Consequently, a target data state in the memory cells C(1,1) to C(M,N) can be identified according to threshold voltages of memory cells C(1,1) to C(M,N).

During programming operations of non-volatile memory devices, there is a tradeoff between reducing programming time and achieving narrow threshold voltage distributions for the different data states for the memory cells C(1,1) to C(M,N). Programming speed can be increased by using a larger program pulse step size. However, this results in large overshoots past the verify level, causing a wide threshold voltage distribution. On the other hand, if a smaller program pulse step size is used, a narrower threshold voltage distribution is achieved at the cost of increased programming time. Another approach is to verify the memory cells C(1,1) to C(M,N) at two separate verify levels for each target data state. Using the cell C(1,1) as an example, before the threshold voltage of the cell C(1,1) reaches a low verify level of its target data state, its bitline bias voltage is set to a low level such as 0V to inject more electrons to the cell C(1,1). When the threshold voltage of the cell C(1,1) is higher than the low verify level, its bitline bias voltage is set to an intermediate level to let the memory cell inject less electrons to the cell C(1,1). When the threshold voltage of the cell C(1,1) exceeds a high verify level of its target data state, its bitline bias voltage is set to a high level such as a system voltage to inhibit programming of the cell C(1,1).

However, this method is not able to handle the issue of instant threshold voltage shift. It is a phenomenon that the programmed threshold voltage shifts down within milliseconds after the programming. The root causes could be holes left from the last erase recombining with injected electrons, injected electrons redistributing in charge-trapping layer, and/or fast detrapping of some electrons in shallow traps at gate interface.

Figure 2:
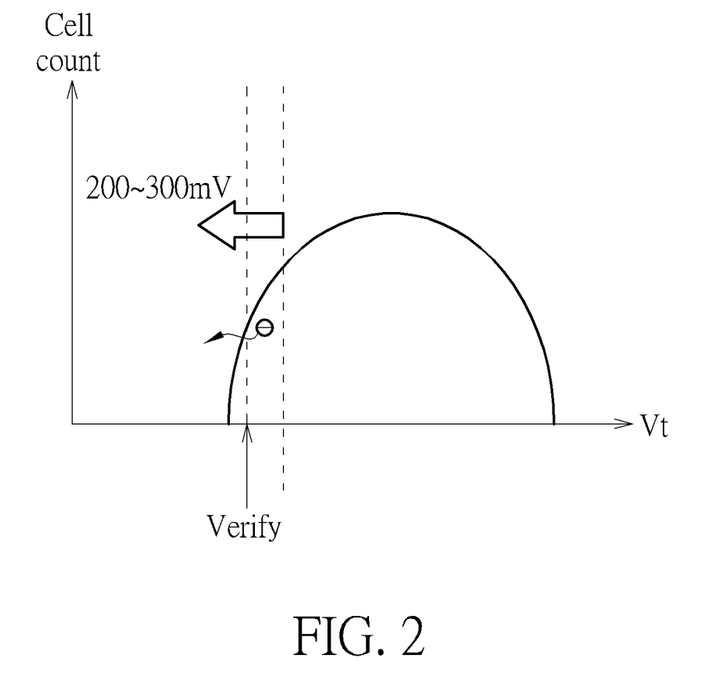
FIG. 2 is a diagram of showing effect of instant threshold voltage shift on threshold voltage distribution.

FIG. 2 is a diagram of showing effect of instant threshold voltage shift on threshold voltage distribution of non-volatile memory cells. The instant threshold voltage shift in this example can be as significant as 200 mV to 300 mV. It may cause data retention error if the threshold voltage shifts down to a level below the verify level of a target data state (Vt distribution low tail).

Similar Vt distribution low tail could also be caused by read noise or random telegraph noise (RTN). Cells with Vt below the target verify level could be read higher than the target verify level because of the noise. Those cells need a chance to be re-programmed to reduce the Vt distribution low tail.

To address this issue, the programming method of four bitline bias voltages is proposed and is described in the following paragraphs.

Figure 3A:
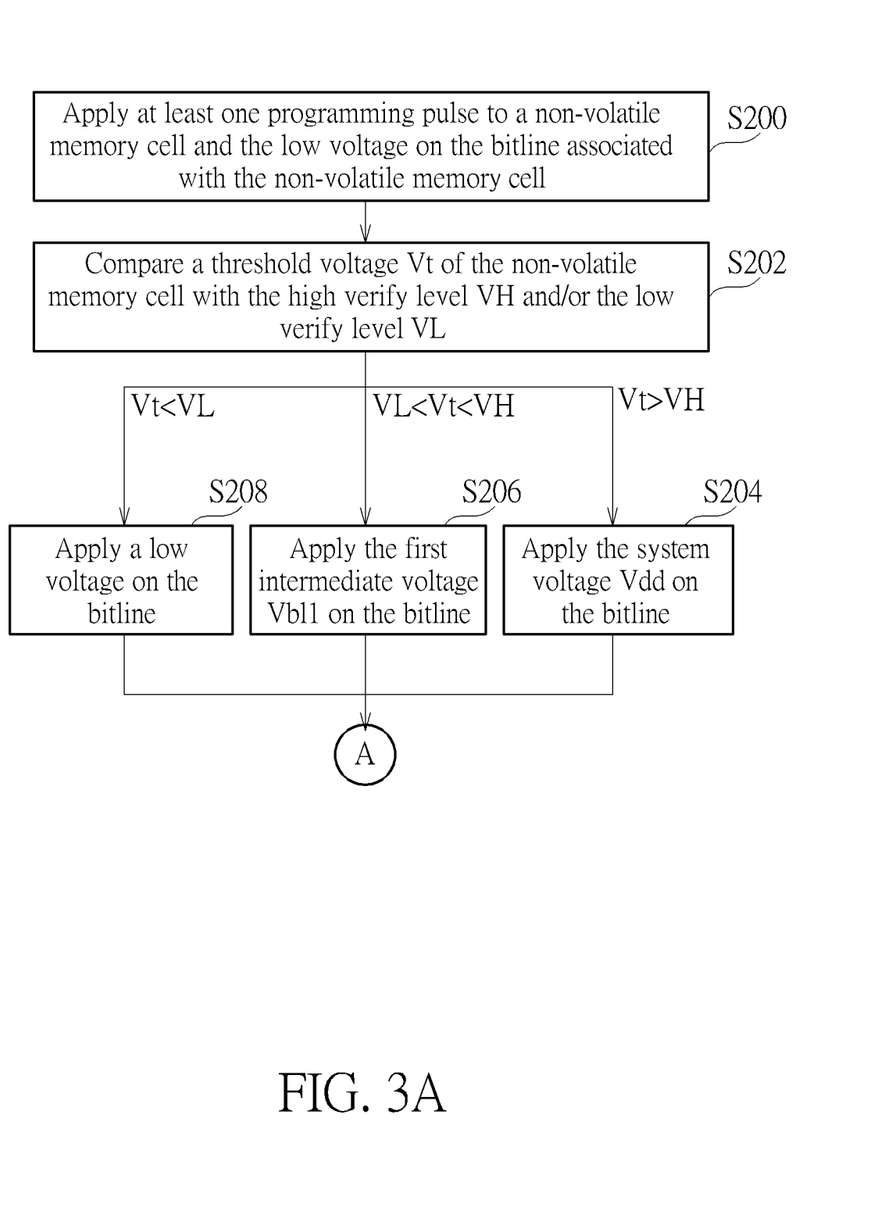
FIGS. 3A and 3B show a flowchart of a program operation method for programming non-volatile memory devices.
Figure 3B:
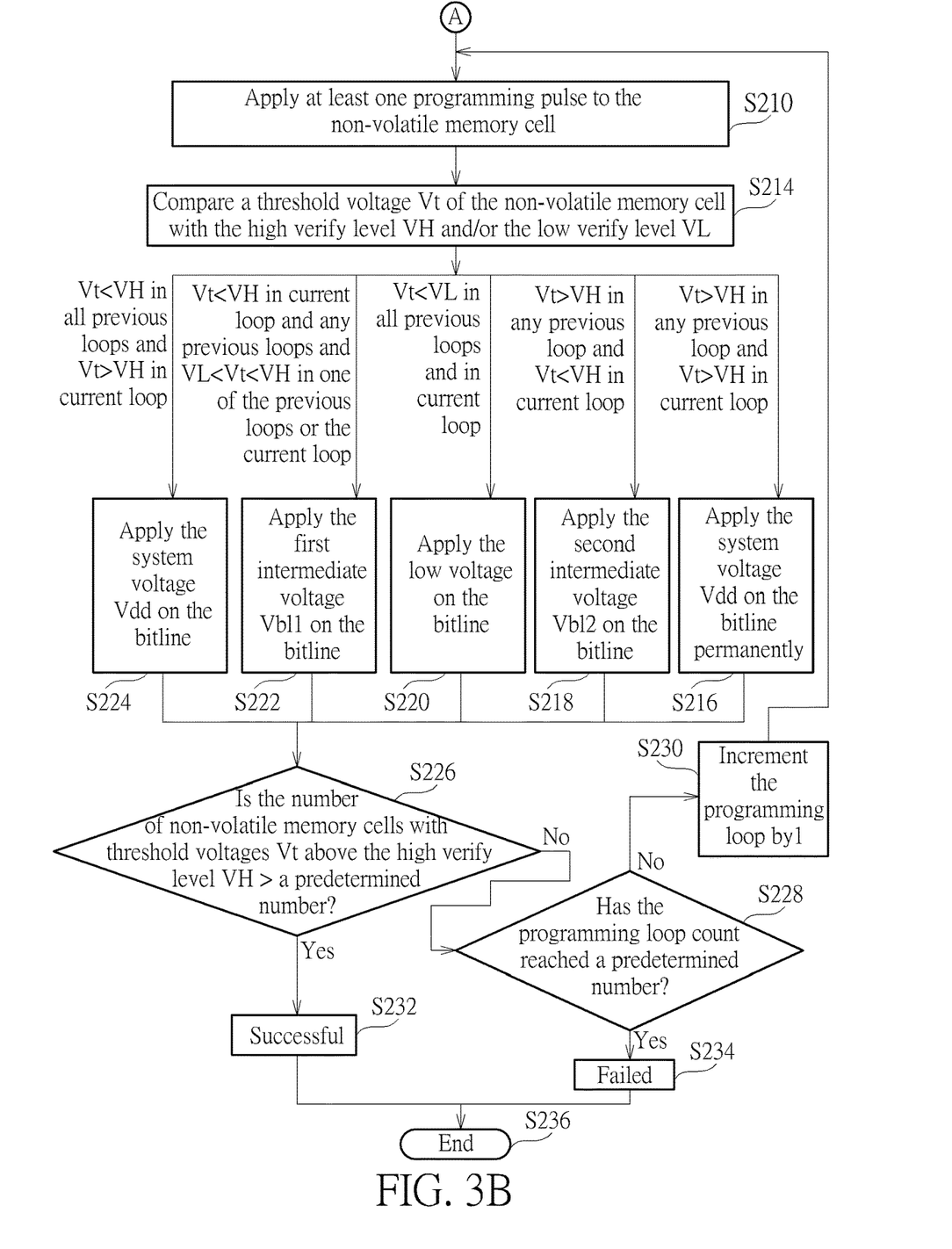

FIGS. 3A and 3B show a flowchart of a program operation method 200 for programming in non-volatile memory devices. The program operation applies incremental-step-pulse programming (ISPP) with multiple bitline bias voltages to a non-volatile memory cell with predetermined parameters including a high verify level VH, a low verify level VL, a system voltage Vdd, a first intermediate voltage Vbl1 and a second intermediate voltage Vbl2, wherein the second intermediate voltage Vbl2 is higher than the first intermediate voltage Vbl1. The method 200 may be applied to a plurality of the memory cells C (1, 1) to C (M, N). The method 200 may include the following steps:

S200: Apply at least one programming pulse to a non-volatile memory cell; apply the low voltage such as 0V on the bitline associated with the non-volatile memory cell;

S202: Compare the threshold voltage Vt of the non-volatile memory cell with the high verify level VH and/or the low verify level VL;
  if the threshold voltage Vt of the non-volatile memory cell is higher than the high verify level VH, proceed to Step S204;
  if the threshold voltage Vt of the non-volatile memory cell is higher than the low verify level VL but lower than the high verify level VH, proceed to Step S206;
  if the threshold voltage Vt of the non-volatile memory cell is lower than the low verify level VL, proceed to Step S208;

S204: Apply the system voltage Vdd on the bitline associated with the non-volatile memory cell; proceed to Step S210;

S206: Apply the first intermediate voltage Vbl1 on the bitline associated with the non-volatile memory cell; proceed to Step S210;

S208: Apply the low voltage on the bitline associated with the non-volatile memory cell; proceed to Step S210;

S210: Apply at least one programming pulse to the non-volatile memory cell; proceed to Step S214;

S214: Compare the threshold voltage Vt of the non-volatile memory cell with the high verify level VH and/or the low verify level VL;
  if the threshold voltage Vt of the non-volatile memory cell is higher than the high verify level VH in the current programming loop, and the threshold voltage Vt of the non-volatile memory cell was higher than the high verify level VH in any of previous programming loops, proceed to Step S216; if the threshold voltage Vt of the non-volatile memory cell is lower than the high verify level VH in the current programming loop, and the threshold voltage Vt of the non-volatile memory cell is higher than the high verify level VH in any of the previous programming loops, proceed to Step S218;
  if the threshold voltage Vt of the non-volatile memory cell is lower than the low verify level VL in all of the previous programming loops and in the current programming loop, proceed to Step S220;
  if the threshold voltage Vt of the non-volatile memory cell is lower than the high verify level VH in all of the previous programming loops and in the current programming loop, and the threshold voltage Vt is higher than the low verify level VL in the current programming loop or any of the previous programming loops, proceed to Step S222;
  if the threshold voltage Vt of the non-volatile memory cell is lower than the high verify level VH in all of the previous programming loops, and higher than the high verify level VH in the current programming loop, proceed to Step S224;

S216: Apply the system voltage Vdd on the bitline associated with the non-volatile memory cell permanently; proceed to Step S226;

S218: Apply the second intermediate voltage Vbl2 on the bitline associated with the non-volatile memory cell; proceed to Step S226;

S220: Apply the low voltage on the bitline associated with the non-volatile memory cell; proceed to Step S226;

S222: Apply the first intermediate voltage Vbl1 on the bitline associated with the non-volatile memory cell; proceed to Step S226;

S224: Apply the system voltage Vdd on the bitline associated with the non-volatile memory cell; proceed to Step S226;

S226: Check whether the number of non-volatile memory cells with threshold voltages Vt above the high verify level VH is greater than a predetermined number; if so, proceed to Step S232, else proceed to Step S228;

S228: Check whether the programming loop count has reached a predetermined number; if so, proceed to Step S234, else proceed to Step S230;

S230: Increment the programming loop and proceed to Step S210 to perform the next programming loop;

S232: Determine that the program operation has been successful; proceed to Step S236;

S234: Determine that the program operation has failed;

S236: End of program operation.

Figure 4:
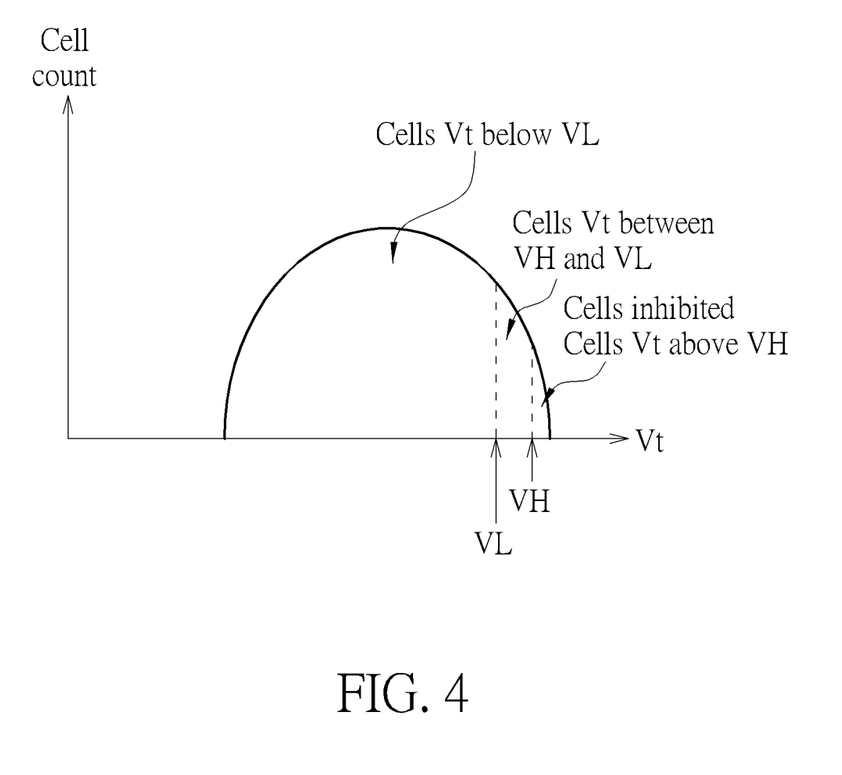
FIG. 4 shows the threshold voltage distribution of a target state.

FIG. 4 shows the threshold voltage distribution of a target state. When performing the method 200, a plurality of memory cells C(1,1) to C(M,N) having threshold voltage Vt below the low verify level VL will be provided the low voltage as the bitline bias voltage. A plurality of memory cells C(1,1) to C(M,N) having threshold voltage Vt between the low verify level VL and the high verify level VH will be provided the first intermediate voltage Vbl1 or the second intermediate voltage Vbl2 as the bitline bias voltage. A plurality of memory cells C(1,1) to C(M,N) having threshold voltage higher than the high verify level VH will be provided the system voltage Vdd as the bitline bias voltage so as to inhabit the cells from being programmed.

The aforementioned method applies multiple bitline bias voltages on a plurality of bitlines associated with the corresponding the non-volatile memory cells according to the result of threshold voltage test in the current programming loop and the previous programming loop. The program operation method 200 can achieve a narrow threshold voltage distribution and maintain fast programming speed while handling the issue caused by instant threshold voltage shift.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for programming in a non-volatile memory device, comprising:
    applying at least one programming pulse to a non-volatile memory cell of the non-volatile memory device during each of previous programming loops;
    applying at least one programming pulse to the non-volatile memory cell during a current programming loop; and
    providing a bitline bias voltage of the non-volatile memory cell according to a result of comparing a threshold voltage of the non-volatile memory cell in at least one of the previous programming loops with a low verify level and/or a high verify level of a target data state of the non-volatile memory cell and a result of comparing a threshold voltage of the non-volatile memory cell in the current programming loop with the low verify level and/or the high verify level of the target data state of the non-volatile memory cell.

2. The method of claim 1 further comprising determining programming is successful when number of non-volatile memory cells having threshold voltages higher than the high verify level has reached a predetermined number.

3. The method of claim 1 further comprising applying at least one programming pulse to the non-volatile memory cell during a next programming loop after the current programming loop if number of non-volatile memory cells having threshold voltages higher than the high verify level is lower than a predetermined number after performing the current programming loop.

4. The method of claim 1 further comprising providing the bitline bias voltage of the non-volatile memory cell in a second programming loop, after performing a first programming loop, according to the result of comparing the threshold voltage of the non-volatile memory cell in the first programming loop with the low verify level and/or the high verify level of the target data state of the non-volatile memory cell.

5. The method of claim 4 wherein providing the bitline bias voltage of the non-volatile memory cell in the second programming loop, after performing the first programming loop, according to the result of comparing the threshold voltage of the non-volatile memory cell in the first programming loop with the low verify level and/or the high verify level of the target data state of the non-volatile memory cell comprises:
    if the threshold voltage is higher than the high verify level of the target data state of the non-volatile memory cell after performing the first programming loop, providing a system voltage as the bitline bias voltage in the second programming loop.

6. The method of claim 4 wherein providing the bitline bias voltage of the non-volatile memory cell in the second programming loop, after performing the first programming loop, according to the result of comparing the threshold voltage of the non-volatile memory cell in the first programming loop with the low verify level and/or the high verify level of the target data state of the non-volatile memory cell comprises:
    if the threshold voltage is between the low verify level and the high verify level of the target data state of the non-volatile memory cell, providing a first intermediate voltage as the bitline bias voltage in the second programming loop.

7. The method of claim 4 wherein providing the bitline bias voltage of the non-volatile memory cell in the second programming loop, after performing the first programming loop, according to the result of comparing the threshold voltage of the non-volatile memory cell in the first programming loop with the low verify level and/or the high verify level of the target data state of the non-volatile memory cell comprises:
    if the threshold voltage is below the low verify level of the target data state of the non-volatile memory cell, providing a low voltage as the bitline bias voltage in the second programming loop.

8. The method of claim 1 wherein providing the bitline bias voltage of the non-volatile memory cell according to the result of comparing the threshold voltage of the non-volatile memory cell in at least one of the previous programming loops with the low verify level and/or the high verify level of the target data state of the non-volatile memory cell and the result of comparing the threshold voltage of the non-volatile memory cell in the current programming loop with the low verify level and/or the high verify level of the target data state of the non-volatile memory cell comprises:
    if the threshold voltage is higher than the high verify level of the target data state of the non-volatile memory cell in any of the previous programming loops and the threshold voltage is higher than the high verify level of the target data state of the non-volatile memory cell in the current programming loop, providing a system voltage as the bitline bias voltage permanently.

9. The method of claim 1 wherein providing the bitline bias voltage of the non-volatile memory cell according to the result of comparing the threshold voltage of the non-volatile memory cell in at least one of the previous programming loops with the low verify level and/or the high verify level of the target data state of the non-volatile memory cell and the result of comparing the threshold voltage of the non-volatile memory cell in the current programming loop with the low verify level and/or the high verify level of the target data state of the non-volatile memory cell comprises:
    if the threshold voltage is higher than the high verify level of the target data state of the non-volatile memory cell in any of the previous programming loops and the threshold voltage is below the high verify level of the target data state of the non-volatile memory cell in the current programming loop, providing a second intermediate voltage as the bitline bias voltage in a next programming loop.

10. The method of claim 1 wherein providing the bitline bias voltage of the non-volatile memory cell according to the result of comparing the threshold voltage of the non-volatile memory cell in at least one of the previous programming loops with the low verify level and/or the high verify level of the target data state of the non-volatile memory cell and the result of comparing the threshold voltage of the non-volatile memory cell in the current programming loop with the low verify level and/or the high verify level of the target data state of the non-volatile memory cell comprises:

if the threshold voltage is below the low verify level of the target data state of the non-volatile memory cell in all of the previous programming loops and the current programming loop, providing a low voltage as the bitline bias voltage in a next programming loop.

11. The method of claim 1 wherein providing the bitline bias voltage of the non-volatile memory cell according to the result of comparing the threshold voltage of the non-volatile memory cell in at least one of the previous programming loops with the low verify level and/or the high verify level of the target data state of the non-volatile memory cell and the result of comparing the threshold voltage of the non-volatile memory cell in the current programming loop with the low verify level and/or the high verify level of the target data state of the non-volatile memory cell comprises:

if the threshold voltage is below the high verify level of the target data state of the non-volatile memory cell in all of the previous programming loops and the current programming loop and the threshold voltage is higher than the low verify level of the target data state of the non-volatile memory cell in the current programming loop and/or at least one of the previous programming loops, providing a first intermediate voltage as the bitline bias voltage, wherein the first intermediate voltage is lower than a second intermediate voltage in a next programming loop.

12. The method of claim 1 wherein providing the bitline bias voltage of the non-volatile memory cell according to the result of comparing the threshold voltage of the non-volatile memory cell in at least one of the previous programming loops with the low verify level and/or the high verify level of the target data state of the non-volatile memory cell and the result of comparing the threshold voltage of the non-volatile memory cell in the current programming loop with the low verify level and/or the high verify level of the target data state of the non-volatile memory cell comprises:

if the threshold voltage is below the high verify level of the target data state of the non-volatile memory cell in all of the previous programming loops and the threshold voltage is higher than the high verify level of the target data state of the non-volatile memory cell in the current programming loop, providing a system voltage as the bitline bias voltage in a next programming loop.

* * * * *